United States Patent
Gong et al.

(10) Patent No.: US 9,893,264 B2
(45) Date of Patent: Feb. 13, 2018

(54) METHOD FOR FORMING A SUSPENDED LITHIUM-BASED MEMBRANE SEMICONDUCTOR STRUCTURE

(71) Applicants: CARNEGIE MELLON UNIVERSITY, Pittsburgh, PA (US); UNIVERSITY OF PENNSYLVANIA, Philadelphia, PA (US)

(72) Inventors: Songbin Gong, Champaign, IL (US); Gianluca Piazza, Pittsburgh, PA (US)

(73) Assignees: Carnegie Mellon University, Pittsburgh, PA (US); University of Pennsylvania, Philadelphia, PA (US)

( * ) Notice: Subject to any disclaimer, the term of this patent is extended or adjusted under 35 U.S.C. 154(b) by 561 days.

(21) Appl. No.: 14/407,762

(22) PCT Filed: Jun. 14, 2013

(86) PCT No.: PCT/US2013/045877
§ 371 (c)(1),
(2) Date: Dec. 12, 2014

(87) PCT Pub. No.: WO2014/035530
PCT Pub. Date: Mar. 6, 2014

(65) Prior Publication Data
US 2015/0162520 A1    Jun. 11, 2015

Related U.S. Application Data

(60) Provisional application No. 61/660,284, filed on Jun. 15, 2012, provisional application No. 61/797,166, filed on Nov. 30, 2012.

(51) Int. Cl.
*H04R 31/00* (2006.01)
*H01L 41/047* (2006.01)
(Continued)

(52) U.S. Cl.
CPC ........ *H01L 41/047* (2013.01); *H01L 41/0477* (2013.01); *H01L 41/1873* (2013.01);
(Continued)

(58) Field of Classification Search
CPC ............... H01L 41/047; H01L 41/1873; H01L 41/0477; H01L 41/313; H01L 41/332;
(Continued)

(56) References Cited

U.S. PATENT DOCUMENTS 5,003,822 A   4/1991  Joshi
5,233,259 A   8/1993  Krishnaswamy et al.
(Continued)

FOREIGN PATENT DOCUMENTS

WO    WO008098404    8/2008
WO    WO014035530    6/2013

OTHER PUBLICATIONS

International Search Report and Written Opinion dated Mar. 27, 2014 for Int'l. Appln. No. PCT/US2013/045877 (8 pgs.).

*Primary Examiner* — Paul D Kim
(74) *Attorney, Agent, or Firm* — Fish & Richardson P.C.

(57) ABSTRACT

In one aspect, a microelectronic device comprises: a suspended lithium-based thin film; and one or more electrodes disposed on the suspended lithium-based thin film, wherein the one or more electrodes comprises one or more fingers, and a width of at least one outer finger of the one or more fingers is smaller than a width of at least one inner finger of the one or more fingers.

32 Claims, 7 Drawing Sheets

(51) Int. Cl.
*H01L 41/187* (2006.01)
*H01L 41/313* (2013.01)
*H01L 41/332* (2013.01)
*H03H 3/02* (2006.01)
*H03H 9/02* (2006.01)
*H03H 9/13* (2006.01)

(52) U.S. Cl.
CPC .......... *H01L 41/313* (2013.01); *H01L 41/332* (2013.01); *H03H 3/02* (2013.01); *H03H 9/02228* (2013.01); *H03H 9/02559* (2013.01); *H03H 9/13* (2013.01)

(58) Field of Classification Search
CPC .. H03H 3/02; H03H 9/02228; H03H 9/02559; H03H 9/13
See application file for complete search history.

(56) References Cited

U.S. PATENT DOCUMENTS

| | | | |
|---|---|---|---|
| 6,445,265 B1 | 9/2002 | Wright | |
| 7,579,663 B2* | 8/2009 | Wan | B81C 1/00095 |
| | | | 257/415 |
| 8,278,802 B1* | 10/2012 | Lee | B81C 1/00476 |
| | | | 29/25.35 |
| 2010/0102669 A1 | 4/2010 | Yamanaka | |

* cited by examiner

METHOD FOR FORMING A SUSPENDED LITHIUM-BASED MEMBRANE SEMICONDUCTOR STRUCTURE

CROSS-REFERENCE TO RELATED APPLICATIONS

This application claims the benefit of priority under 35 U.S.C. § 119(e) to provisional U.S. Patent Application No. 61/797,166 filed Nov. 30, 2012, and provisional U.S. Patent Application No. 61/660,284 filed Jun. 15, 2012, the entire contents of each of which are hereby incorporated by reference.

STATEMENT REGARDING FEDERALLY SPONSORED RESEARCH

This invention was made with government support under contract number N66001-10-1-4005-00007274 and HR0011-12-1-0004 awarded by the Defense Advanced Research Projects Agency (DARPA). The government has certain rights in the invention.

FIELD OF USE

The present disclosure relates generally to microelectronic structures, and specifically to microelectronic structures with suspended lithium-based thin films.

BACKGROUND

Resonators are used in radio frequency (RF) communication systems. Generally, resonators need to be high quality (high-Q), low loss, and stable, and have a low motional impedance.

SUMMARY

The present disclosure describes methods and apparatus relating to suspended lithium-based membrane microelectronic structures. The suspended lithium-based membrane microelectronic structures may be implemented in resonant micro-electro-mechanical systems (MEMS), other moving structures, or both. The suspended lithium-based membrane microelectronic structures may be used for multi-frequency wideband multiplexers and reconfigurable RF front ends. Multi-frequency MEMS resonators produced from the suspended lithium-based membranes may simultaneously achieve high electromechanical coupling ($k_t^2$) and a high quality factor (Q).

In one aspect of the present disclosure, a microelectronic device comprises: a suspended lithium-based thin film; and one or more electrodes disposed on the suspended lithium-based thin film, wherein the one or more electrodes comprises one or more fingers, and a width of at least one outer finger of the one or more fingers is smaller than a width of at least one inner finger of the one or more fingers.

Implementations of the disclosure can include one or more of the following features. The suspended lithium-based thin film comprises one or more of lithium niobate or lithium tantalate. An average thickness of the lithium-based thin film is between 100 nm and 30 µm. The one or more electrodes comprise one or more of aluminum, gold, platinum, molybdenum, or copper. Each of the one or more electrodes are configured to receive a signal. At least one of the one or more electrodes has an average thickness between 5 nm and 150 nm. The one or more fingers comprise one or more inter-digital fingers. A width of at least one outer inter-digital finger of the one or more inter-digital fingers is smaller than a width of at least one inner inter-digital finger of the one or more inter-digital fingers. A center frequency of the microelectronic device is based on a pitch of at least one finger of the one or more fingers. A frequency of operation of the microelectronic device is based on one or more of a number of the one or more fingers and a spacing among at least a portion of the one or more fingers. The frequency of operation of the microelectronic device is between about 1 MHz and 10 GHz. A chip comprising a plurality of microelectronic devices. A first one of the plurality of microelectronic devices has a first bandwidth and a second one of the plurality of microelectronic devices has a second bandwidth, and wherein the first bandwidth differs from the second bandwidth.

In another aspect of the present disclosure, a method for forming a suspended lithium-based membrane semiconductor structure comprises: depositing a bonding agent on a surface of a lithium-based carrier substrate; implanting ions into a surface of a lithium-based donor substrate; forming, based on implanting, an ion-implanted surface of the lithium-based donor substrate; bonding the ion-implanted surface of the lithium-based donor substrate to the bonding agent; removing the lithium-based donor substrate from the ion-implanted surface that is bonded to the bonding agent, with at least a portion of the ion-implanted surface remaining bonded to the bonding agent following removal; forming, based on removing, a lithium-based membrane on the bonding agent, with the lithium-based membrane comprising the at least a portion of the ion-implanted surface that remains bonded to the bonding agent; forming one or more electrodes on the lithium-based membrane; etching at least one release window extending through the lithium-based membrane to the bonding agent; and removing, using the at least one release window, the bonding agent to suspend a portion of the lithium-based membrane with respect to the lithium-based carrier substrate.

Implementations of the disclosure can include one or more of the following features. The bonding agent comprises one or more of an adhesive agent or an oxide. The adhesive agent comprises one or more of benzocyclobutene or polyimide. The lithium-based carrier substrate and the lithium-based donor substrate each comprise one or more of lithium niobate or lithium tantalate. A thickness of the ion-implanted surface of the lithium-based donor substrate is based on an amount of ions that are implanted and is further based on an energy of the ions that are implanted. The average thickness of the ion-implanted surface of the lithium-based donor substrate is between 100 nm and 30 µm. The method further comprises: prior to bonding the ion-implanted surface of the lithium-based donor substrate to the bonding agent, forming one or more additional electrodes on the ion-implanted surface of the lithium-based donor substrate. Removing the lithium-based donor substrate from the ion-implanted surface that is bonded to the bonding agent comprises: heating the lithium-based donor substrate at a temperature based on an amount and energy of the ions implanted on the lithium-based donor substrate; and removing, based on heating, the lithium-based donor substrate from the ion-implanted surface that is bonded to the bonding agent. The temperature is an average temperature between 200 degrees Celsius and 350 degrees Celsius. The lithium-based donor substrate is heated between two hours and twelve hours. The lithium-based donor substrate comprises an X-cut substrate. The method further comprises: after removal of the lithium-based donor substrate, polishing an exposed surface of the lithium-based membrane to reduce roughness of the exposed surface of the lithium-based membrane. The roughness of the exposed surface of the lithium-based membrane is less than 5 nm. Forming the one or more electrodes on the lithium-based membrane comprises: forming the one or more electrodes using one or more of physical sputtering, electron-beam evaporation, and thermal evaporation. The one or more electrodes comprise one or more of aluminum, gold, platinum, molybdenum, or copper. Each of the one or more electrodes comprise one or more fingers. At least one of the one or more fingers has an average thickness between 5 nm and 150 nm. The one or more fingers of the one or more electrodes comprise a plurality of inter-digital fingers. A width of at least one outer inter-digital finger of the plurality of inter-digital fingers is smaller than a width of at least one inner inter-digital finger of the plurality of inter-digital fingers. Etching the at least one release window extending through the lithium-based membrane to the bonding agent comprises: depositing an etch mask layer over the lithium-based membrane and the one or more electrodes; depositing a photo-resist layer on the etch mask layer; etching a pattern in the photo-resist layer; transferring the pattern of the photo-resist layer to the etch mask layer; and stripping away the photo-resist layer. The etch mask layer comprises one or more of an oxide or a nitride. Depositing an etch mask layer over the lithium-based membrane and the one or more electrodes comprises: depositing an etch mask layer over the lithium-based membrane and the one or more electrodes using plasma-enhanced chemical vapor deposition or physical sputtering. Transferring the pattern of the photo-resist layer to the etch mask layer comprises: transferring the pattern of the photo-resist layer to the etch mask layer using reactive ion etching with a fluorine-based etching recipe. The method further comprises: after removing the bonding agent, removing the etch mask layer. Removing the etch mask layer comprises: removing the etch mask layer using reactive ion etching with a fluorine-based etching recipe. Etching the at least one release window extending through the lithium-based membrane to the bonding agent comprises: etching the at least one release window using reactive ion etching or inductively-coupled plasma etching with a chlorine-based solvent. Removing the bonding agent comprises: releasing an etchant in the at least one release window using a liquid chemical etch or a vapor etch. The etchant comprises one or more of a sulfuric acid based etchant or a hydrofluoric acid based etchant. The method further comprises: performing drying after removing the bonding agent. Performing drying comprises: performing point drying after removing the bonding agent. A micro-electro-mechanical system (MEMS) comprising a suspended lithium-based membrane semiconductor structure formed according to the method. A moving structure comprising a suspended lithium-based membrane semiconductor structure formed according to the method.

The details of one or more implementations are set forth in the accompanying drawings and the description below. Other features, objects, and advantages will be apparent from the description, the drawings, and the claims.

DETAILED DESCRIPTION

Figure 1:
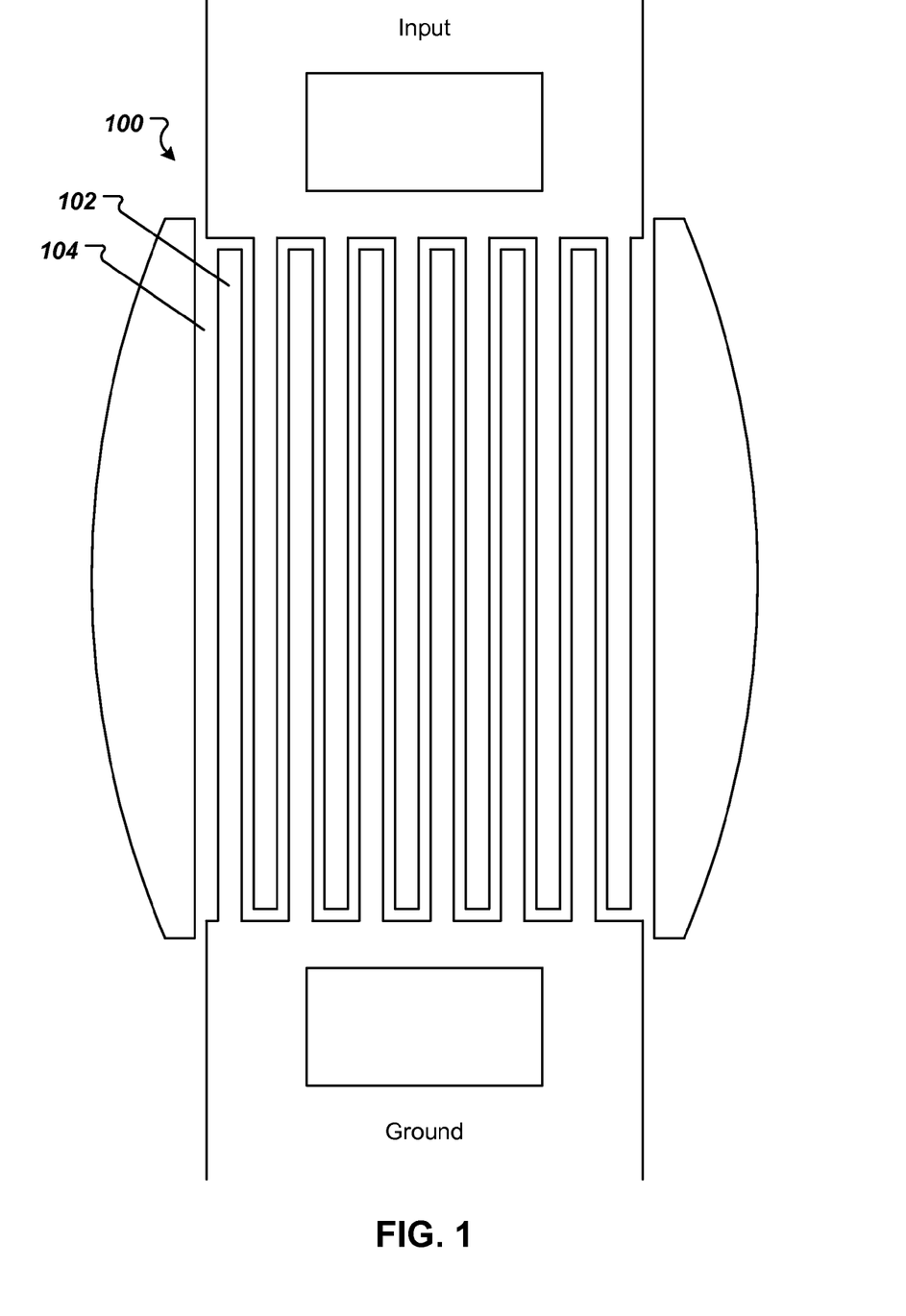
FIG. 1 shows an example of a suspended lithium-based membrane microelectronic device.

FIG. 1 shows an example of a suspended lithium-based membrane microelectronic device 100. The device 100 may include inter-digital transducer (IDT) metal electrodes 102 on a suspended lithium-based membrane 104. The term "lithium-based" as used in this disclosure, refers to materials that include lithium as part of their composition. For example, the lithium-based membrane 104 may include lithium niobate (LN), lithium tantalite (LT), or both. The electrodes 102 may be evenly spaced and may each have identical width.

The suspended lithium-based membrane microelectronic device 100 may be operated as a resonator by applying an alternating voltage across adjacent electrodes 102. For example, the electrodes 102 may be alternatively connected different signals, such as a ground signal and an input signal, which may be applied to the device 100 to induce an electric field within the device 100. The associated electric field generates a mechanical deformation or strain in the lithium-based membrane 104 through a piezoelectric effect and excites lateral expansion and compression of the membrane 104 (a mode of vibration known as $S_0$ lamb wave). A charge is generated when the membrane 104 vibrates. When the frequency of the applied electric field coincides with the mechanical resonance frequency of the suspended lithium-based membrane 104, the mechanical vibrations are enhanced, and the device 100 effectively behaves as a resonator. The mode of vibration of the suspended lithium-based membrane 104 may depend on the geometry of the membrane 104 and the size and pitch of the electrodes 102. Several modes of vibration may be excited, such as shear, length-extensional, width-extensional, lamb, and flexural acoustic waves.

The device 100 with a membrane 102 of LN material may have a higher intrinsic electromagnetic coupling ($k_t^2$) than an Aluminum Nitride (AlN) Contour Mode Resonator (CMR). A center frequency of the device 100 may be based on the lithographically defined pitch of the electrode fingers, which may enable multi-frequency resonators on a single chip. Full suspension of the device may efficiently trap energy and enhance the quality factor (Q) with respect to LN-saw acoustic wave (SAW) devices. The high velocity (e.g., approximately 6500 m/s) of the selected $S_0$ lamb wave mode may enable higher frequencies of operation (e.g., frequencies of approximately 1 MHz to 10 GHz) using the same lithographic resolution of SAW devices.

Figure 2:
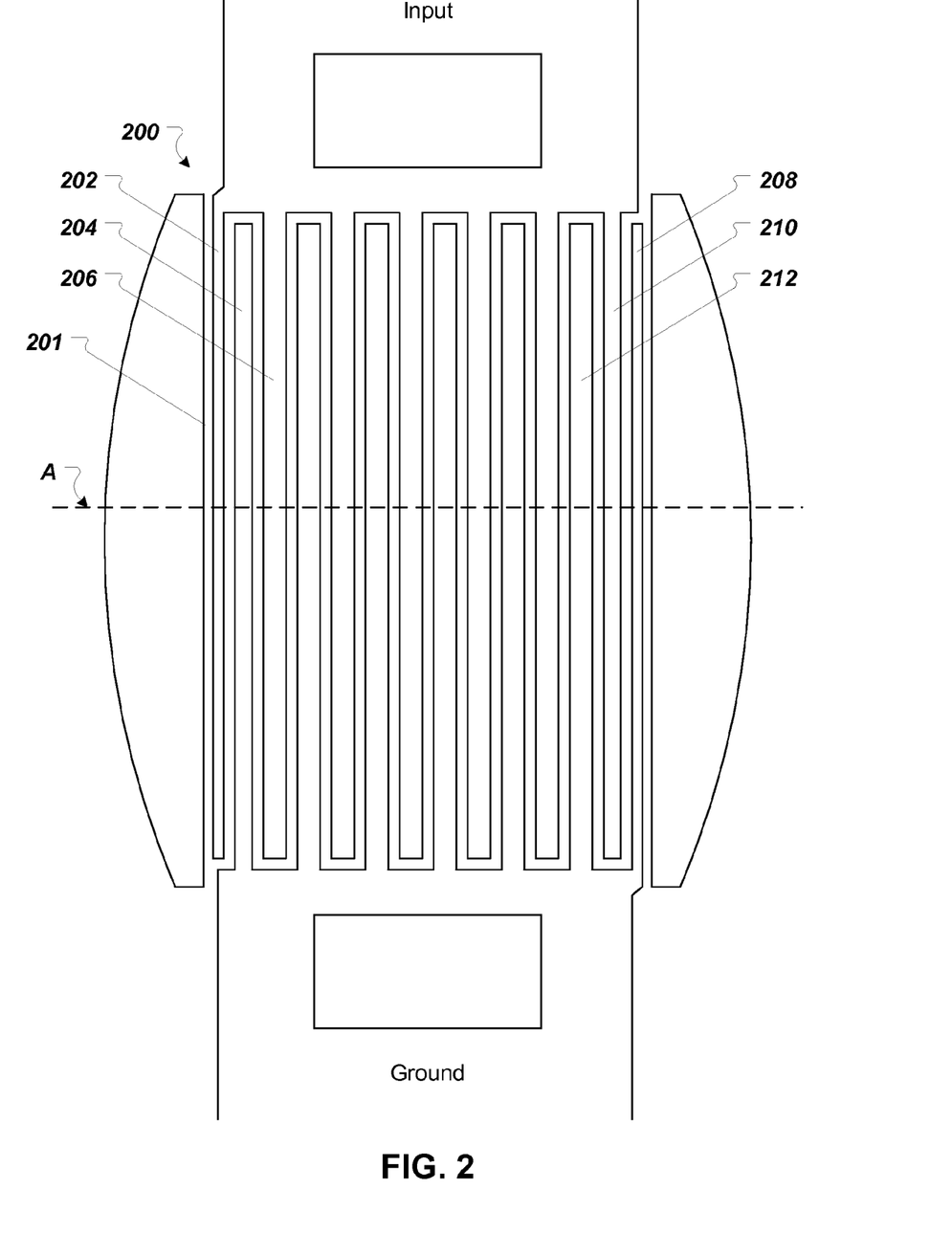
FIG. 2 shows an example of a suspended lithium-based membrane microelectronic device with a weighted electrode configuration.

FIG. 2 shows an example of a suspended lithium-based membrane microelectronic device 200 with a weighted electrode configuration on a suspended lithium-based thin film 201. For the weighted electrode configuration, the widths of electrodes may be gradually reduced toward the edges of the device 200. Center and inner electrodes having identical width are referred to as unweighted electrodes. Electrodes having smaller widths than the unweighted electrodes are referred to as weighted electrodes. A device 200 may have any number of weighted and unweighted electrodes.

For the device 200 of FIG. 2, the two electrodes close to an edge of the device 200 are weighted electrodes. For example, the electrodes 202 and 204 close to the left edge of the device 200 are weighted electrodes. The width of electrode 202 is smaller than the width of electrode 204. The width of the electrode 204 is smaller than the width of electrode 206. Similarly, the electrodes 208 and 210 close to the right edge of the device are weighted electrodes. The width of electrode 208 is smaller than the width of electrode 210. The width of electrode 210 is smaller than the width of electrode 212. The electrodes 206 and 212 and electrodes between the electrodes 206 and 212 may be unweighted electrodes having identical width.

Figure 3:
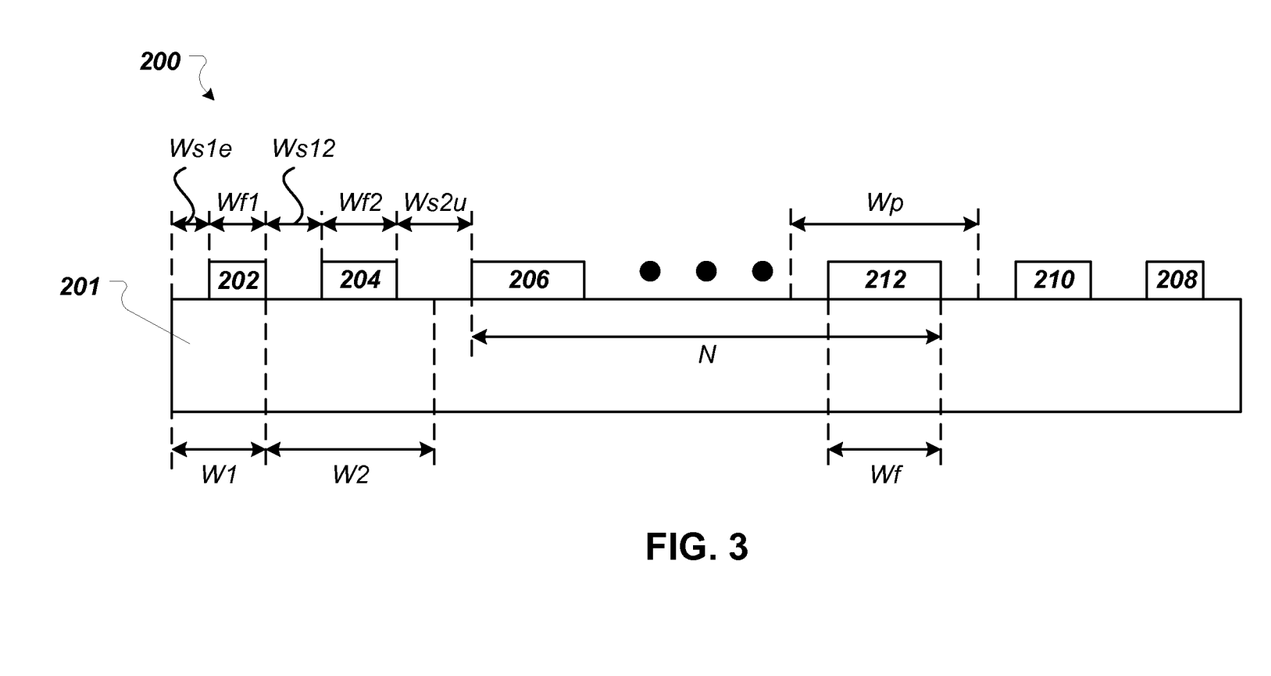
FIG. 3 is a cross-sectional view of the device of FIG. 2.

FIG. 3 is a cross-sectional view of the device 200 of FIG. 2 along line A. Examples of design parameters for the device 200 and values are listed in Table 1 below. In Table 1, $\lambda$ refers to the acoustic wavelength of the desired design frequency. The unweighted electrodes 206 and 212 may be centered on their respective fingers. The weighted electrodes 202, 204, 208, and 210 may be centered or off-centered on their respective fingers. Multiple design variations are possible to control the performance of the device 200. For example, the number of fingers and relative spacing can be altered (increased or decreased) depending on the frequency of operation and the number of fingers forming the device 200.

TABLE 1

| Parameter | Description | Value |
|---|---|---|
| N | Number of unweighted electrodes | 0-100 |
| Wp | Unweighted electrode finger pitch | $\lambda/2$ |
| Wf | Unweighted electrode width | $\lambda/8-\lambda/2$ |
| W1 | Weighted electrode 202 finger width | $3\lambda/16-5\lambda/16$ |
| Wf1 | Weighted electrode 202 width | $\lambda/16-5\lambda/16$ |
| W2 | Weighted electrode 204 finger width | $\lambda/2$ |
| Wf2 | Weighted electrode 204 width | $\lambda/8-\lambda/2$ |
| Ws12 | Spacing between weighted electrodes 202 and 204 | $\lambda/8-\lambda/2$ |
| Ws2u | Spacing between weighted electrode 204 and last unweighted electrode 206 | $\lambda/8-2\lambda/3$ |
| Ws1e | Spacing between weighted electrode 202 and membrane 201 edge/acoustic boundary | $0-3\lambda/16$ |

Operation of the device 200 of FIGS. 2 and 3 is similar to the operation of the device 100 of FIG. 1. The device 100, however, may introduce unwanted spurious modes and overtone resonances due to the high intrinsic electromagnetic coupling ($k_t^2$) of the LN material, which may be reduced or prevented by the weighted electrode configuration of the device 200. The device 200 may be more efficient than the device 100 and may maximize the intrinsic electromagnetic coupling of the LN material by dispersing the energy in various modes. The mechanical energy within the device 200 is concentrated into the fundamental $S_0$ lamb wave mode, and unwanted parasitic modes may be significantly subdued. As a result, the electromagnetic coupling of the fundamental response may be significantly enhanced.

The device 200 of FIG. 2 meets temperature stability requirements for existing commercial RF bands. The temperature coefficient of frequency (TCF) for devices 200 with three orientations of electrode patterns, namely 30°, 50°, and 70° to +Y axis, are listed below in Table 2. For the device 200 at 30° orientation, the TCF is −74 ppm/K, which may be higher than for an AlN CMR (−30 ppm/K) but lower than for a LN-SAW device (−90 ppm/K).

TABLE 2

| Orientation (to +Y) | TCF (ppm/K) |
|---|---|
| 30° | −74 |
| 50° | −76 |
| 70° | −63 |

Figure 4:
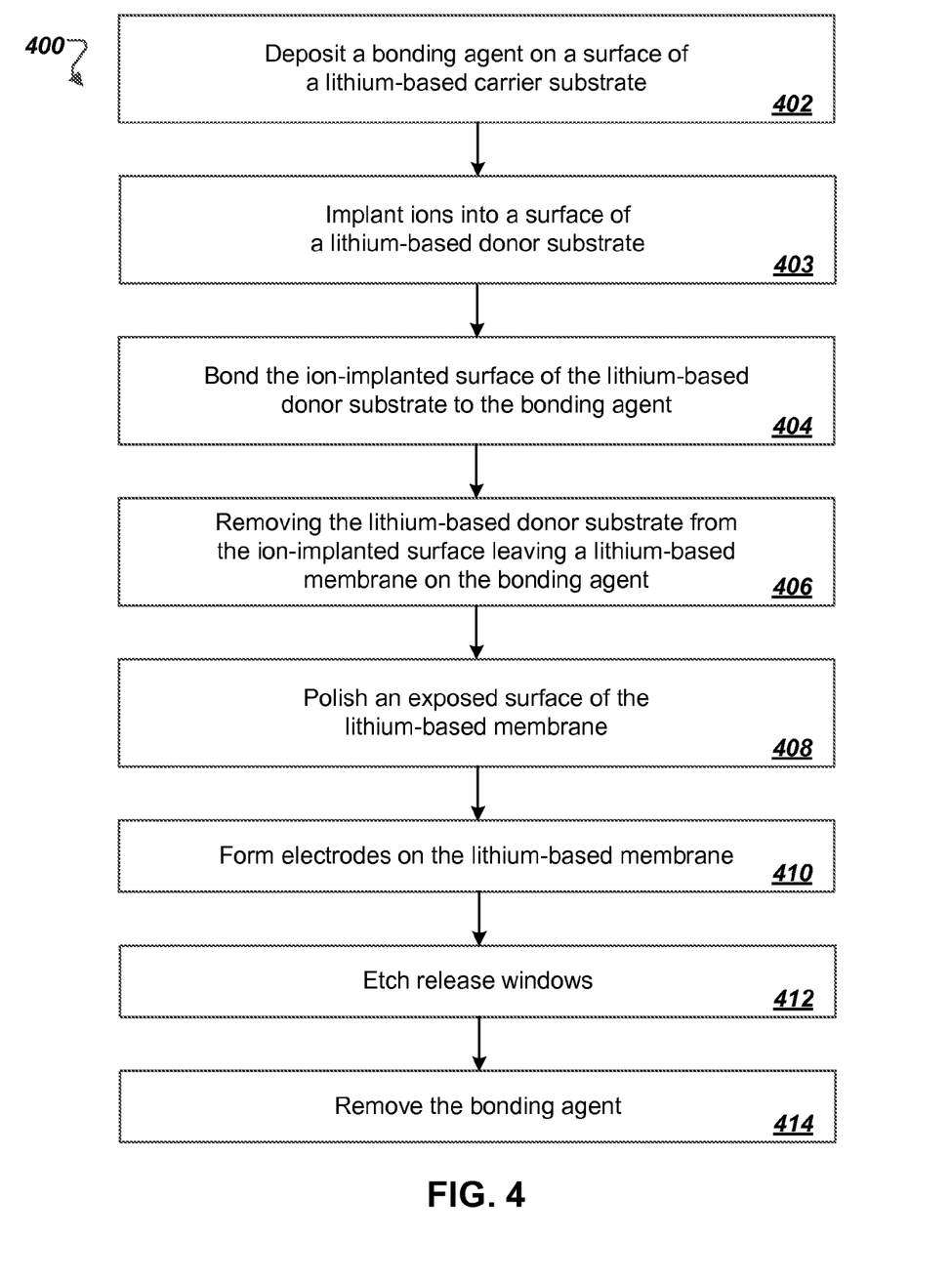
FIG. 4 is a flowchart of an example of a process for forming suspended lithium-based membrane microelectronic structures.

FIG. 4 is a flowchart of an example of a process 400 for forming suspended lithium-based membrane microelectronic structures, e.g., the device 100 of FIG. 1 and the device 200 of FIG. 2. Briefly, the process 400 includes depositing a bonding agent on a surface of a lithium-based carrier substrate (402), implanting ions into a surface of a lithium-based donor substrate to form an ion-implanted surface of the lithium-based donor substrate (403), bonding the ion-implanted surface of the lithium-based donor substrate to the bonding agent (404), removing the lithium-based donor substrate from the ion-implanted surface leaving a lithium-based membrane on the bonding agent (406), polishing an exposed surface of the lithium-based membrane (408), forming one or more electrodes on the lithium-based membrane (410), etching at least one release window extending through the lithium-based membrane to the bonding agent (412), and removing the bonding agent (414). The process 400 will not be described in more detail with reference to FIG. 4.

Figure 5:
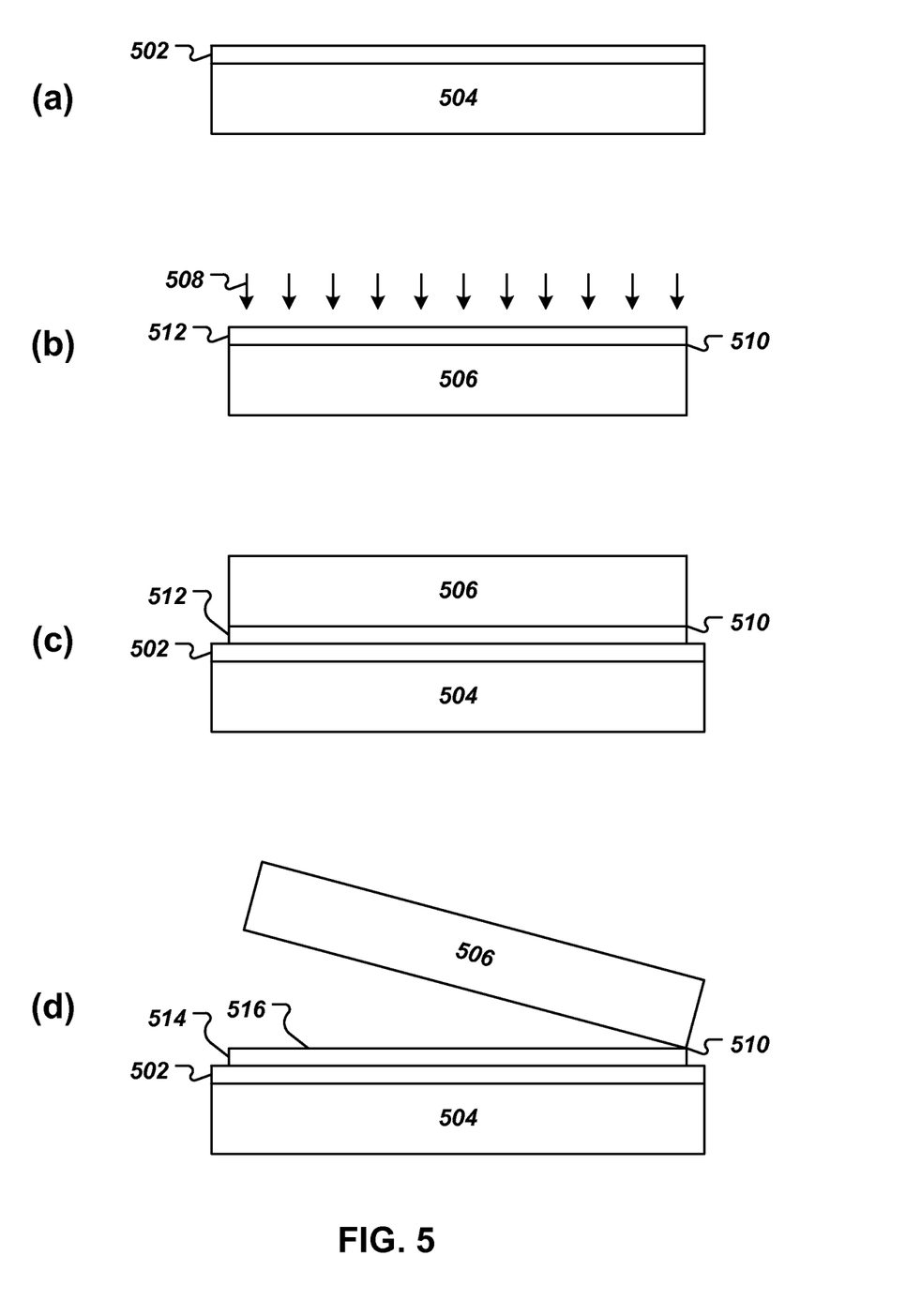
FIGS. 5-7 show side views of a suspended lithium-based membrane microelectronic structure during different stages of fabrication.
Figure 6:
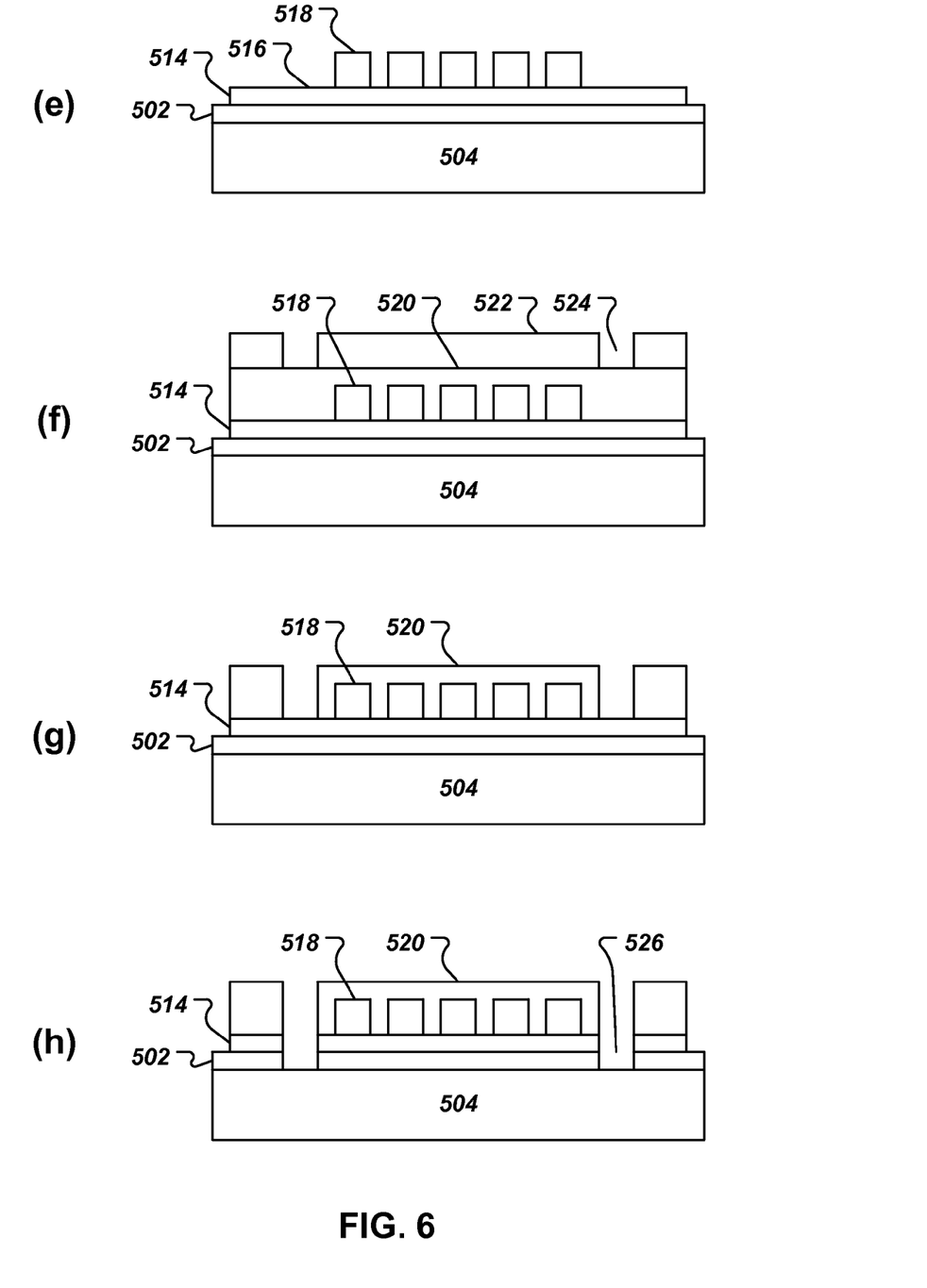
Figure 7:
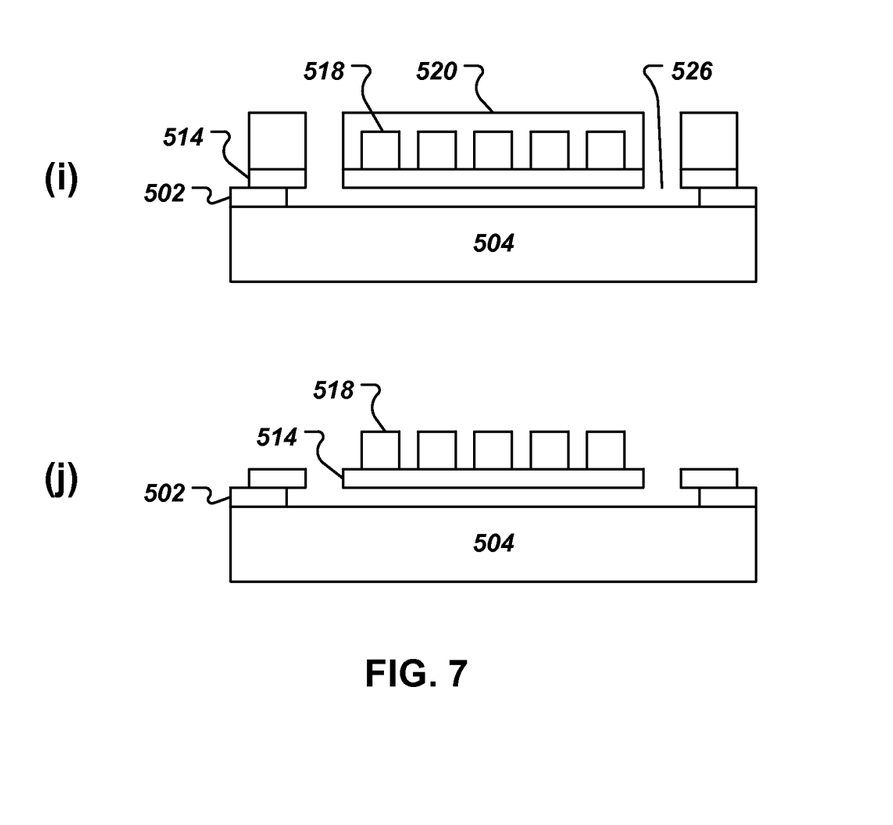

FIGS. 5-7 show side views of a suspended lithium-based membrane microelectronic structure during different stages (a)-(j) of fabrication. A bonding agent 502 is deposited on a surface of a lithium-based carrier substrate 504 in stage (a). The lithium-based carrier substrate 504 may be LN, LT, or both. The bonding agent 502 may be either an adhesive agent, such as benzocyclobutene (BCB) or polyimide, or an oxide, such as $SiO_2$. The bonding agent 502 may be deposited on the substrate 504 using any suitable deposition technique. The bonding agent 502 may serve as a sacrificial layer for suspending the microelectronic structure.

In stage (b), a lithium-based donor substrate 506 is implanted with ions 508 to form an ion-implanted surface of the lithium-based donor substrate. The lithium-based donor substrate 506 may be an X-cut substrate, and implantation may be performed on the X-cut substrate. An X-cut substrate is a substrate which was grown with a particular orientation. The implanted ions 508 may penetrate the donor substrate 506 from a surface of the substrate 506 to a depth represented by an ion implantation line 510. A dose of ions may be selected to enable high yield splitting of the donor substrate 506 at low temperatures, e.g., a temperature less than 350° C. A thickness of the ion implanted surface 512 may be controlled by the amount, energy, or both of the ions 508 implanted on the donor substrate 506. The relationship between ion energy and thickness of the ion implanted surface 512 may be non-linear and regulated by ion scattering relationship. In some implementations, the average thickness of the ion-implanted surface 512 is in the range between approximately 100 nm and 30 μm. In some implementations, an electrode (not shown) may be formed on the ion-implanted surface 512 of the donor substrate 506 using, e.g., any suitable patterning technique.

In stage (c), the ion-implanted surface 512 of the lithium-based donor substrate 506 is bonded to the bonding agent 502 on the lithium-based carrier substrate 504. The ion-implanted surface 512 may be bonded to the bonding agent 502 using any suitable bonding technique.

In stage (d), the lithium-based donor substrate 506 is removed from the ion-implanted surface that is bonded to the bonding agent. After removal of the lithium-based donor substrate 506, at least a portion of the ion-implanted surface 512 remains bonded to the bonding agent as a lithium-based membrane 514. In some implementations, the portion of the ion-implanted surface 512 left as the membrane 514 is the entire ion-implanted surface 512. In other implementations, the portion of the ion-implanted surface 512 left as the membrane 514 may be less than the entire ion-implanted surface 512.

The lithium-based donor substrate 506 may be removed from the ion-implanted surface using a heat treating technique that causes the donor substrate 506 to split along the implantation line 510. The amount and energy of the ion implantation on the lithium-based donor substrate 506 may be selected to enable splitting to occur at relatively low temperatures, e.g., temperatures less than 350° C. For example, the donor substrate 506 may be heated at an average temperature of 200° C. to 350° C. between two to twelve hours.

After the donor substrate 506 splits leaving the lithium-based membrane 514, the lithium-based membrane 514 may be chemically polished, mechanically polished, or both to reduce roughness of the exposed surface 516 of the membrane 514. In some implementations, the roughness of the exposed surface 516 may be reduced to less than approximately 5 nm.

At stage (e), electrodes 518 are formed on the lithium-based membrane 514. The electrodes 518 may be formed using any suitable lithography or metal deposition techniques such as physical sputtering, electron-beam evaporation, thermal evaporation, or a combination of techniques. The electrodes 518 may include any suitable metal, metallic thin film, or a combination of metals or metallic thin films. Examples of suitable metallic materials include aluminum, gold, platinum, molybdenum, or copper. The electrodes 518 may be in the form of inter-digital electrode fingers. For example, the electrodes 518 may be inter-digital titanium electrodes having an average thickness of 5 nm, or inter-digital aluminum electrodes having an average thickness of 150 nm.

Stages (f)-(h) show an example of a technique for etching release windows that extend through the membrane 514 to the bonding agent 502. After the electrodes 518 are formed, an etch mask layer 520 may be deposited over the electrodes 518 and the lithium-based membrane 516 at stage (f). The etch mask layer 520 may prevent the erosion of the electrodes 518 by the etching chemicals during etching of the release windows. The etch mask layer 520 may serve as a protective layer for the electrodes 518 during removal of the bonding agent. The etch mask layer 520 may be deposited with a plasma-enhanced chemical vapor deposition system or a physical sputtering system. The etch mask layer 520 may include either an oxide or a nitride, such as $SiO_2$.

A photo-resist layer 522 may be deposited over the etch mask layer 520. The photo-resist layer 522 may include polymers. Patterns 524 may be etched in the photo-resist layer 522 using any suitable lithography technique.

At stage (g), the patterns 524 of the photo-resist layer 522 may be transferred to the etch mask layer 520. A reactive ion etching (RIE) technique with a recipe using fluorine-based chemistry may be used to transfer the patterns 524 to the etch mask layer 520. The recipe may be $Cl_2$ based. The photo-resist layer 522 may be stripped away after the transfer of the patterns 524 to the etch mask layer is complete.

At stage (h), release windows 526 may be etched on two or four sides of the set of electrodes 518. The release windows 526 define the boundaries for the microelectronic structure. The release windows 526 extend through the lithium-based membrane 514 to the bonding agent 502. The release windows 526 may be etched using a chlorine-based solvent, and the etch mask layer 520 protects the electrodes 518 from the chlorine. The release windows 526 may be etched using reactive ion etching or inductively coupled plasma etching.

At stage (i), the bonding agent 502 under the set of electrodes 518 is removed, resulting in the suspension of the lithium-based membrane 514 with respect to the lithium-based carrier substrate 504. The bonding agent 502 may be removed through an etch release. The etch release may be performed by releasing an etchant in the release windows 526. The etchant released may be a sulfuric acid-based etchant, such as Nanostrip or piranha, a hydrofluoric acid-based etchant, such as a buffered oxide etchant, or any other suitable etchant that will remove the bonding agent 502 without etching the etch mask layer 520. When using a sulfuric acid-based etchant or a hydrofluoric acid-based etchant, the etch release process may be either a liquid chemical etch or a vapor etch. A critical point drying (CPD) may be performed to enable full suspension of the membrane 514 after removing the bonding agent 502. The resulting membrane 514 may be fully suspended on the carrier substrate with four tethers placed near the corners of the structure.

The etching technique shown in stages (f)-(h) may yield straighter sidewall definition for orientations with high electromechanical coupling (e.g., 20-40° to +Y axis), which may enhance the Q of the structure. The parameters for optimized RIE compared to original RIE using a Trion system are listed below in Table 3.

TABLE 3

| Parameter | Optimized | Original |
| --- | --- | --- |
| $Cl_2$ | 5 sccm | 10 sccm |
| $BCl_3$ | 15 sccm | 25 sccm |
| Ar | 20 sccm | 10 sccm |
| Temp | 65° C. | 65° C. |
| RIE power | 280 W | 250 W |
| ICP power | 600 W | 600 W |
| Pressure | 10 mT | 15 mT |
| Etch rate | 45 nm/min | 40 nm/min |

By introducing a higher ratio of Ar to the gas mixture, a previously observed RIE dependence on orientation is mitigated. As a result of the better defined acoustic boundaries of the structure using optimized RIE, the Q may be improved from 300 to 1300. Combined with a high electromagnetic coupling, a FOM of 280 at 30° to +Y axis may be achieved. Such FOM may result in a low motional resistance of 18Ω. As the orientation of the structure increases to a larger angle, the motional impedance may increase due to the diminishing electromagnetic coupling. Despite the impedance increase, this feature may be used to design filters with different bandwidths on the same chip.

In stage (j), the etch mask layer 520 is removed. The lithium-based membrane 514 with the electrodes 518 is suspended after the etch mask later 520 is removed. The etch mask layer 520 may be removed using reactive ion etching with a fluorine-based recipe. After the bonding agent 502 and the etch mask layer 520 are removed, any post etch residue and liquid remaining under the suspended lithium-based membrane 514 may be removed using a critical point dryer system. In implementations where electrodes (not shown) are formed on the ion-implanted surface 512 prior to the bonding at stage (c), electrodes 518 are formed on the top and electrodes (not shown) are formed on the bottom of the suspended lithium based membrane 514.

A number of implementations have been described. Nevertheless, various modifications can be made without departing from the spirit and scope of the processes and techniques described herein. In addition, the processes depicted in the figures do not require the particular order shown, or sequential order, to achieve desirable results. In addition, other steps can be provided, or steps can be eliminated, from the described processes, and other components can be added to, or removed from, the describe apparatus and systems. Accordingly, other embodiments are within the scope of the following claims.

What is claimed is:

1. A method for forming a suspended lithium-based membrane semiconductor structure, the method comprising:
   depositing a bonding agent on a surface of a lithium-based carrier substrate;
   implanting ions into a surface of a lithium-based donor substrate;
   forming, based on implanting, an ion-implanted surface of the lithium-based donor substrate;
   bonding the ion-implanted surface of the lithium-based donor substrate to the bonding agent;
   removing the lithium-based donor substrate from the ion-implanted surface that is bonded to the bonding agent, with at least a portion of the ion-implanted surface remaining bonded to the bonding agent following removal;
   forming, based on removing, a lithium-based membrane on the bonding agent, with the lithium-based membrane comprising the at least a portion of the ion-implanted surface that remains bonded to the bonding agent;
   forming one or more electrodes on the lithium-based membrane;
   etching at least one release window extending through the lithium-based membrane to the bonding agent; and
   removing, using the at least one release window, the bonding agent to suspend a portion of the lithium-based membrane with respect to the lithium-based carrier substrate.

2. The method of claim 1, wherein the bonding agent comprises one or more of an adhesive agent or an oxide.

3. The method of claim 2, wherein the adhesive agent comprises one or more of benzocyclobutene or polyimide.

4. The method of claim 1, wherein the lithium-based carrier substrate and the lithium-based donor substrate each comprise one or more of lithium niobate or lithium tantalate.

5. The method of claim 1, wherein a thickness of the ion-implanted surface of the lithium-based donor substrate is based on an amount of ions that are implanted and is further based on an energy of the ions that are implanted.

6. The method of claim 5, wherein the average thickness of the ion-implanted surface of the lithium-based donor substrate is between 100 nm and 30 nm.

7. The method of claim 1, further comprising:
   prior to bonding the ion-implanted surface of the lithium-based donor substrate to the bonding agent, forming one or more additional electrodes on the ion-implanted surface of the lithium-based donor substrate.

8. The method of claim 1, wherein removing the lithium-based donor substrate from the ion-implanted surface that is bonded to the bonding agent comprises:
   heating the lithium-based donor substrate at a temperature based on an amount and energy of the ions implanted on the lithium-based donor substrate; and
   removing, based on heating, the lithium-based donor substrate from the ion-implanted surface that is bonded to the bonding agent.

9. The method of claim 8, wherein the temperature is an average temperature between 200 degrees Celsius and 350 degrees Celsius.

10. The method of claim 8, wherein the lithium-based donor substrate is heated between two hours and twelve hours.

11. The method of claim 1, wherein the lithium-based donor substrate comprises an X-cut substrate.

12. The method of claim 1, further comprising:
   after removal of the lithium-based donor substrate, polishing an exposed surface of the lithium-based membrane to reduce roughness of the exposed surface of the lithium-based membrane.

13. The method of claim 12, wherein the roughness of the exposed surface of the lithium-based membrane is less than 5 nm.

14. The method of claim 1, wherein forming the one or more electrodes on the lithium-based membrane comprises:
   forming the one or more electrodes using one or more of physical sputtering, electron-beam evaporation, and thermal evaporation.

15. The method of claim 1, wherein the one or more electrodes comprise one or more of aluminum, gold, platinum, molybdenum, or copper.

16. The method of claim 1, wherein each of the one or more electrodes comprise one or more fingers.

17. The method of claim 16, wherein at least one of the one or more fingers has an average thickness between 5 nm and 150 nm.

18. The method of claim 16, wherein the one or more fingers of the one or more electrodes comprise a plurality of inter-digital fingers.

19. The method of claim 18, wherein a width of at least one outer inter-digital finger of the plurality of inter-digital fingers is smaller than a width of at least one inner inter-digital finger of the plurality of inter-digital fingers.

20. The method of claim 1, wherein etching the at least one release window extending through the lithium-based membrane to the bonding agent comprises:
   depositing an etch mask layer over the lithium-based membrane and the one or more electrodes;
   depositing a photo-resist layer on the etch mask layer;
   etching a pattern in the photo-resist layer;
   transferring the pattern of the photo-resist layer to the etch mask layer; and
   stripping away the photo-resist layer.

21. The method of claim 20, wherein the etch mask layer comprises one or more of an oxide or a nitride.

22. The method of claim 20, wherein depositing an etch mask layer over the lithium-based membrane and the one or more electrodes comprises:
   depositing an etch mask layer over the lithium-based membrane and the one or more electrodes using plasma-enhanced chemical vapor deposition or physical sputtering.

23. The method of claim 20, wherein transferring the pattern of the photo-resist layer to the etch mask layer comprises:
   transferring the pattern of the photo-resist layer to the etch mask layer using reactive ion etching with a fluorine-based etching recipe.

24. The method of claim 20, further comprising:
   after removing the bonding agent, removing the etch mask layer.

25. The method of claim 24, wherein removing the etch mask layer comprises:
   removing the etch mask layer using reactive ion etching with a fluorine-based etching recipe.

26. The method of claim 1, wherein etching the at least one release window extending through the lithium-based membrane to the bonding agent comprises:
   etching the at least one release window using reactive ion etching or inductively-coupled plasma etching with a chlorine-based solvent.

27. The method of claim 1, wherein removing the bonding agent comprises:
   releasing an etchant in the at least one release window using a liquid chemical etch or a vapor etch.

28. The method of claim 27, wherein the etchant comprises one or more of a sulfuric acid based etchant or a hydrofluoric acid based etchant.

29. The method of claim 1, further comprising:
   performing drying after removing the bonding agent.

30. The method of claim 29, wherein performing drying comprises:
   performing point drying after removing the bonding agent.

31. A micro-electro-mechanical system (MEMS) comprising a suspended lithium-based membrane semiconductor structure formed according to the method of claim 1.

32. A moving structure comprising a suspended lithium-based membrane semiconductor structure formed according to the method of claim 1.

\* \* \* \* \*

UNITED STATES PATENT AND TRADEMARK OFFICE
CERTIFICATE OF CORRECTION

PATENT NO. : 9,893,264 B2  
APPLICATION NO. : 14/407762  
DATED : February 13, 2018  
INVENTOR(S) : Songbin Gong and Gianluca Piazza It is certified that error appears in the above-identified patent and that said Letters Patent is hereby corrected as shown below:

In the Claims

Column 9, Line 59, Claim 6, delete "30 nm." and insert -- 30 μm. --

Signed and Sealed this  
Twenty-second Day of May, 2018

Andrei Iancu  
*Director of the United States Patent and Trademark Office*

UNITED STATES PATENT AND TRADEMARK OFFICE
CERTIFICATE OF CORRECTION

PATENT NO. : 9,893,264 B2
APPLICATION NO. : 14/407762
DATED : February 13, 2018
INVENTOR(S) : Songbin Gong and Gianluca Piazza Page 1 of 1

It is certified that error appears in the above-identified patent and that said Letters Patent is hereby corrected as shown below:

In the Specification

Column 1, Line 18, delete "This invention was made with government support under contract number N66001-10-1-4005-00007274 and HR0011-12-1-0004 awarded by the Defense Advanced Research Projects Agency (DARPA). The government has certain rights in the invention" and insert -- This invention was made with United States government support under HR0011-12-1-0004 and N66001-10-1-4005 awarded by the Defense Advanced Research Projects Agency (DARPA). The U.S. government has certain rights in the invention --

Signed and Sealed this
Twenty-fourth Day of December, 2024

Derrick Brent
*Acting Director of the United States Patent and Trademark Office*